United States Patent [19]

Peterson

[11] Patent Number: 5,329,175
[45] Date of Patent: Jul. 12, 1994

[54] REDUCED NOISE, LOW POWER, HIGH SPEED OUTPUT BUFFER

[75] Inventor: Craig M. Peterson, Austin, Tex.

[73] Assignee: Advanced Micro Devices, Inc., Austin, Tex.

[21] Appl. No.: 976,264

[22] Filed: Nov. 13, 1992

[51] Int. Cl.⁵ ............... H03K 19/003; H03K 19/0948
[52] U.S. Cl. .................... 307/443; 307/451; 307/473; 307/263
[58] Field of Search ............ 307/451, 443, 473, 263

[56] References Cited

U.S. PATENT DOCUMENTS

| | | | |
|---|---|---|---|
| 4,638,187 | 1/1987 | Boler et al. | 307/451 |
| 4,725,747 | 2/1988 | Stein et al. | 307/443 |
| 4,959,565 | 9/1990 | Knecht et al. | 307/473 |
| 4,961,010 | 10/1990 | Davis | 307/443 |
| 5,025,181 | 6/1992 | Farmer | 307/571 |
| 5,025,182 | 6/1992 | Farmer | 307/571 |
| 5,036,232 | 6/1991 | Jungert et al. | 307/443 |
| 5,103,118 | 4/1992 | Peterson | 307/443 |
| 5,231,311 | 7/1993 | Ferry et al. | 307/451 |

Primary Examiner—Edward P. Westin
Assistant Examiner—Jon Santamauro
Attorney, Agent, or Firm—Kevin L. Daffer

[57] ABSTRACT

A reduced noise, low power, high speed output buffer circuit is provided for driving a load. The output buffer circuit utilizes multiple stage pull-up and pull-down transistors. During the time in which the first stage pull-down (or pull-up) transistor is activated, all of the opposing pull-up (or pull-down) transistors are deactivated at substantially the same time. Thereafter, the remaining stages of pull-down (or pull-up) transistors are activated. Delayed turn on in conjunction with rapid turn off achieves low overshoot and undershoot noise transient levels at the power supplies.

12 Claims, 3 Drawing Sheets

REDUCED NOISE, LOW POWER, HIGH SPEED OUTPUT BUFFER

BACKGROUND OF THE INVENTION

1. Field of the Invention

This invention relates to an output buffer circuit and more particularly to a buffer circuit which, when operating in transition between logic levels, maintains a reduced noise level in the power supplies of an integrated circuit incorporating the buffer circuit.

2. Background of the Relevant Art

A buffer circuit used for increasing output drive characteristics is well known. Often, a source cannot provide the necessary drive required by a load. In this case, a buffer circuit may be placed intermediate the source and load, whereby the source drives the buffer and the buffer drives the load. Buffer circuits are thereby often used in situations where a large fan-out number is encountered which would exceed the capability of a non-buffered source. Buffers circuits can also be used to drive output loads that are normally adapted for higher or lower current and/or voltage levels. As such, buffers are often incorporated as voltage/current level converters placed between monolithic integrated circuits having dissimilar logic technology (e.g., TTL-to-CMOS or CMOS-to-TTL). A buffer used as a voltage/current level converter or driver can also suffice as an interface between digital and analog domains. For example, analog switches or relays can be interconnected to receive buffered digital signals from digitally controlled devices such as a microcontroller. Thus, a buffer circuit may or may not provide gain, it may or may not reverse the logic level between the input and output signals; however, a buffer circuit generally does provide current isolation for driving an increased fan-out load or for maintaining compatibility with various output loads.

Conventional output buffer circuits often employ a single stage output driver circuit comprising a single pull-up transistor and a single pull-down transistor. The buffered output signal is formed whenever the pull-up transistor or the pull-down transistor is activated. In order to reduce transient current or crowbar current, the pull-up and pull-down transistors are preferably activated at different times as generally described in U.S. Pat. Nos. 5,025,181 and 4,638,187. U.S. Pat. No. '181 requires mismatched threshold values between the pull-up and pull-down transistors to ensure the transistors are not activated at the same time. Similarly, U.S. Pat. No. '187 utilizes an inverter to delay turn on of the pull-up transistor with respect to the pull-down transistor.

During the time in which the single stage driver transistors (either the pull-up or pull-down transistor) are activated, a current spike may occur in the power supplies. Whenever, for example, the pull-down transistor is activated, the output load capacitance is discharged through the current path formed between the load and the ground supply (e.g., VSS). Acceleration of sinking current brings about a positive voltage across the output ground lead inductance proportional to $L(di/dt)$. The positive voltage results in a voltage rise, ground bounce or overshoot of relatively short duration in the ground supply. Similarly, deceleration of sinking current causes a voltage decline, ground droop or undershoot in the ground supply, below VSS voltage. Using a converse example, whenever the pull-up transistor is activated, the output load is charged through the current path formed between the load and the positive supply (e.g., VDD). Acceleration of sourcing current produces a negative voltage across the output ground lead inductance proportional to $L(di/dt)$. The negative voltage results in a voltage drop or undershoot in the positive supply. Undershoot is generally of short duration below the ideal VDD amount. Deceleration of sourcing current causes a short voltage increase or overshoot in the ground supply, above VDD voltage.

In an effort to reduce undershoot and overshoot noise problems occurring on the power supplies of an integrated circuit incorporating the buffer, many conventional buffer circuits utilize two or more output driver stages operating at two different times during an output transition. Examples of disclosures which describe multiple output driver stages include U.S. Pat. Nos. 4,961,010 and 5,103,118. Both U.S. Pat. Nos. '010 and '118 require a resistance element placed intermediate the gate terminals of each pull-up and pull-down driver. The resistance element ensures a delay between the turning on of successive stages; however, the resistance element may dampen or slow down the turning off of opposing stage. For example, during transition from low to high state at the buffer output, it is important that the pull-down transistors be adequately turned off before the pull-up transistors are turned on. Otherwise, the pull-up and pull-down transistors may both be momentarily on thereby allowing transient current to flow directly between the power supplies. Such a result would add considerable power consumption to the device operation. Placing resistive elements within the discharge or charge path of the pull-up and pull-down gate capacitors may add undesirable RC delay in turning off the opposing drivers. Using the rising edge output transition example stated above, the resistive element will oppose rapid change in the pull-down transistor gate. Accordingly, the pull-down transistor may not be able to turn off as rapidly as the first stage pull-up transistor turns on. Still further, prior gate resistive designs do not ensure that all of the opposing drivers are turned off at the same time, or that all the opposing drivers are turned off during the time in which the desired first driver in a series of successive delayed drivers is turned on. If one of the opposing multiple stage driver (e.g., either the first, second or third stage pull-up transistor) remains momentarily on during the time in which the desired driver (e.g., the first stage pull-down transistor) is turned on, then an undesirable direct current path between positive supply and ground supply may occur.

As defined herein, "opposing drivers" refers to the pull-up transistors which are configured opposite the pull-down transistors or, conversely, refers to the pull-down transistors which are configured opposite the pull-up transistors. In addition, the term "desired driver" refers to the driver which is currently activated. If, for example, the desired driver is one of the stages of pull-down transistors, then the opposing drivers are the multiple stages of pull-up transistors. As further defined herein, "overshoot" is a positive voltage spike induced on either the first or second power supplies. Conversely, "undershoot" is a negative voltage spike induced on either the first or second power supplies. First power supply is defined as the most positive power supply (e.g., VDD), whereas the second power supply is defined as the most negative power supply (e.g., VSS or ground). Overshoot upon the first power supply is caused by decelerating sourcing current delivered from the first power supply to the load device. Overshoot upon the second power supply is caused by accelerating sinking current delivered to the second power supply from the load. Undershoot upon the first power supply is caused by accelerating sourcing current delivered from the first power supply to the load. Undershoot upon the second power supply is caused by decelerating sinking current delivered to the second power supply from the load device.

SUMMARY OF THE INVENTION

The problems outlined above are in large part solved by the output buffer circuit of the present invention. That is, the output buffer circuit hereof utilizes multiple output driver stages for reducing induced overshoot and undershoot noise in the power supplies during periods of output transition. Moreover, the output buffer circuit of the present invention utilizes feed forward circuits to ensure all of the opposing pull-up (or pull-down) transistors are deactivated during the time in which the desired pull-down (or pull-up) initial stage transistor is activated. By deactivating all the opposing driver stages simultaneously and during turn on of the desired initial driver stage, a direct current flow path between power supplies is prevented. Therefore, the present invention operates in a low-power environment while maintaining proper delay between successive stages to ensure minimum transient noise upon the power supplies.

Broadly speaking, the present invention contemplates a reduced noise, low power, high speed buffer output circuit. The buffer circuit comprises first, second and third pull-up transistors connected in parallel between a first power supply and an output terminal. First, second and third pull-down transistors are connected in parallel between a second power supply and the output terminal. A feed forward circuit is coupled to the first, second and third pull-up transistors as well as the first, second and third pull-down transistors. Whenever the output buffer circuit receives falling edge input, the feed forward circuit turns off the first, second and third pull-up transistors at substantially the same time and at approximately the same time in which the first pull-down transistor is turned on. After the first pull-on transistor is turned on, a delay period occurs before the second pull-down transistor is turned on. Similarly, another delay period exists after the second pull-on transistor is turned on and before the third pull-down transistor is turned on. Thus, turning on of stages of pull-down transistors after the pull-up transistors are all off ensures di/dt is significantly reduced. A lesser di/dt will translate to a lowering of the overshoot and undershoot noise upon the second power supply during the falling edge transient period. Conversely, whenever the output buffer receives rising edge input, the feed forward circuit turns off the first, second and third pull-down transistors at substantially the same time and at approximately the same time in which the first pull-up transistor is turned on. After the first pull-up transistor is turned on, the second and third pull-up transistors are subsequently turned on in delayed succession. By turning on the pull-up transistors in succession, di/dt will be lessened thereby resulting in a lowering of the overshoot and undershoot noise upon the first power supply during the transient period.

The present invention further contemplates a passgate circuit connected to a gate terminal of the first stage pull-up transistor and to a gate terminal of the first stage pull-down transistor. A tri state circuit having an output coupled to the passgate circuit allows the passgate circuit to receive a digital input signal and pass the input signal to the gate terminal of the first pull-up transistor and to the gate terminal of the first pull-down transistor.

The present invention further contemplates dissimilar current carrying capacities for the first, second and third pull-down transistors and dissimilar current carrying capacities for the first, second and third pull-up transistors. Preferably, the first pull-down transistor is configured having a smaller gate width than the second and third pull-down transistors. Likewise, the first pull-up transistor is configured having a smaller gate width than the second and third pull-up transistors. If a rising edge input is received, the first pull-up transistor sources an initial accelerating and decelerating surge of current to the load device from a first power supply. Soon thereafter, the second pull-up transistor and successive third pull-up transistors source additional accelerating and decelerating current surges. However, the combined accelerating and decelerating current surges is spread over multiple time durations thereby decreasing the combined di/dt value. Conversely, if a falling edge input is received, the first pull-down transistor sinks an initial accelerating and decelerating surge of current from the load device to a second power supply. Soon thereafter, the second pull-down transistor and successive third pull-down transistors sink additional accelerating and decelerating current surges. Similar to a rising edge input, the falling edge input is processed in multiple stages whereby di/dt is spread over a longer cumulative time duration effecting a decrease in the combined di/dt value.

BRIEF DESCRIPTION OF THE DRAWINGS

Other objects and advantages of the invention will become apparent upon reading the following detailed description and upon reference to accompanying drawings in which.

Figure 1:
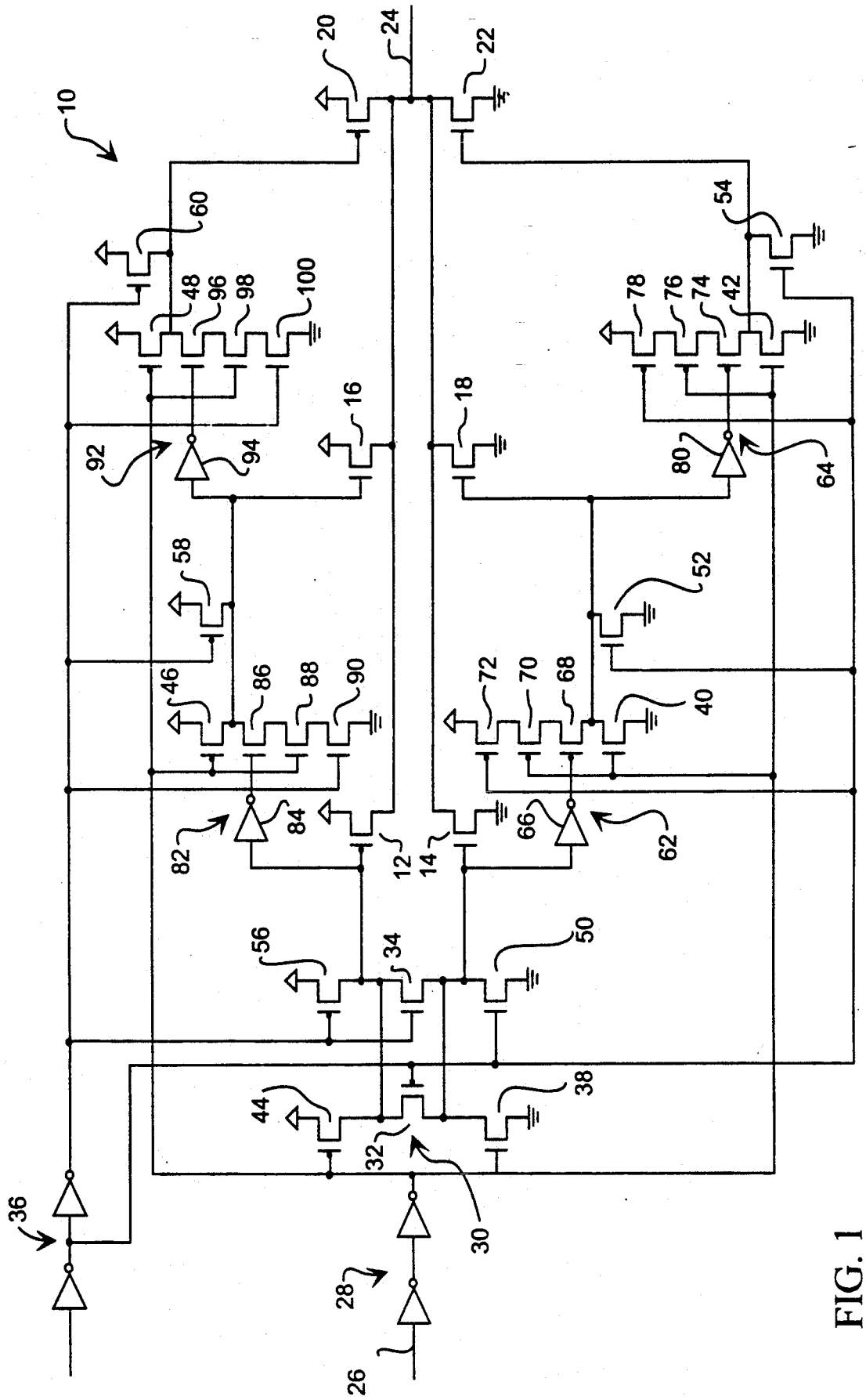
FIG. 1 is a circuit diagram of a output buffer circuit according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates an output buffer circuit 10 according to the present invention. Buffer 10 includes multiple stage output drivers of which three stages provide a suitable if not preferred design. Each driver stage includes a pull-up and a pull-down transistor. The first stage includes a first pull-up transistor 12 and a first pull-down transistor 14. Second pull-up transistor 16 and third pull-up transistor 20 are coupled in parallel with first transistor 12. Similarly, second pull-down transistor 18 and third pull-down transistor 22 are coupled in parallel with first pull-down transistor 14. Pull-up and pull-down transistors 12, 14, 16, 18, 20 and 22 provide current isolation between an output load (not shown) coupled to output terminal 24 and an input signal received from a source (not shown) coupled to input terminal 26. Each pull-up transistor is capable of sourcing substantial amounts of current from a first power supply to the load. Preferably, first pull-up transistor has a smaller current carrying capacity than transistors 16 and 20. As such, the magnitude of sourcing current will gradually build from initial turn on of transistor 12 to subsequent staged and delayed turn on of transistors 16 and 20, transistors 16 and 20 configured to have greater current carrying capacities than transistor 12. Dissimilar current carrying capacities are achieved by sizing the gate widths of transistor 12 less than the gate width of transistor 16. Further, transistor 16 gate width is designed to be less than transistor 20 gate width. Each pull-up transistor 12, 16 and 20 is generally placed within or near the saturation region during normal drive operation. Each transistor 12, 16 and 20 preferably receives substantially equal voltage magnitudes upon respective gate terminals.

Conversely, pull-down transistors 14, 18 and 22 sink current from a load device to a second power supply, the second power supply being generally less is voltage magnitude than the first power supply. Transistor 14 is preferably of smaller gate width than transistors 18 and 22. Gradual current sinking thereby occurs over a staged time duration. Transistors 14, 18 and 22 operate similar to transistors 12, 16 and 20 except that pull-down transistors 14, 18 and 22 sink current from a load as opposed to pull-up transistors 12, 16 and 20 which source current to a load. The load generally operates at a voltage level between the first and second powers supplies.

Staged turn on of successive pull-up and pull-down transistors is initiated at the first pull-up or pull-down transistor 12 or 14. Turn on begins when the gate terminal of transistor 12 or 14 receives an activating voltage magnitude. Thereafter, turn on of successive stages occurs after a set delay period elapses. The turn on voltage magnitude may be either a high or a low logic level. It is important to note that "transistors" as used herein include integrated circuit field effect transistors, FETs, of different technologies including MOS and bipolar technologies. A suitable transistor technology includes CMOS, wherein p-channel transistors are designated having a small circle shown at the gate terminal. N-channel transistors do not indicate such a circle at the gate terminal.

A digital input signal is sent to an input terminal 26 through a series connected buffer circuit 28 and through a passgate circuit 30. Buffer circuit 28 may be omitted and is not needed for the functioning of circuit 10. However, if used, buffer circuit 28 does help reduce the load seen on input terminal 26. Passgate circuit 30 receives output from buffer circuit 28 as well as transistors 38 and 44, and then passes an inverted signal from buffer 28, transistors 38 and 44 to the gate terminal of transistors 12 or 14. Passgate circuit 30 includes two transistors 32 and 34 having their gate terminals connected to the output of tri state circuit 36. Passgate circuit 30 will not allow passing of inverted input signal to the output drivers if the passgate transistors 32 and 34 are non-enabled. Transistors 32 and 34 are deactivated if the input signal to tri state circuit is at a non-enable logic level (e.g., at a relatively low logic state). Many different forms can be used to accomplish tri state input of the enable logic signal. One such form is shown in FIG. 1 as including two series connected inverters with opposite logic levels produced at the output of each inverter. The opposite logic levels, which are connected to p-channel and n-channel transistor 32 and 34, respectively, ensure that either both transistors are on or that both transistors are off depending upon the logic state of the input signal placed upon the tri state circuit 36.

Also included in circuit 10 are first, second and third feed forward transistors 38, 40 and 42 coupled between the second power supply and a gate terminal of first, second and third pull-down transistors 14, 18 and 22, respectively. Similarly, fourth, fifth and sixth feed forward transistors 44, 46 and 48 are coupled between the first power supply and a gate terminal of the first, second and third pull-up transistors 12, 16, and 20, respectively. First, second and third disable transistors 50, 52 and 54 are coupled in parallel with transistor 38, 40 and 42 and are adapted to receive disable output signal from tri state circuit 36. An opposite logic level disable output signal clocks fourth, fifth and sixth disable transistors 56, 58 and 60. Disable transistors 56, 58 and 60 are coupled in parallel with transistors 44, 46 and 48 as shown.

Feed forward transistors 38, 40 and 42, being preferably n-channel devices, operate to simultaneously receive a rising edge input signal to thereby deliver substantially the second power supply upon the gate terminals of pull-down transistors 14, 18 and 22. The second power supply placed at the gate terminals ensures that pull-down transistors 14, 18 and 22 are simultaneously turned off during times of rising edge input. Conversely, if the input signal is a falling edge input, then fourth, fifth and sixth feed forward transistors 44, 46 and 48 place substantially the first power supply simultaneously upon the gates of transistors 12, 16 and 20 resulting in their simultaneous turn off. As such, feed forward transistors 38, 40, 42, 44, 46 and 48 serve to turn off multiple opposing drivers. If, for example, a rising edge input is received, then all three opposing driver (pull-down transistors 14, 18 and 22) are turned off at approximately the same time in which initial stage desired pull-up transistor 12 is activated.

Subsequent turn on of second and third stages of drivers is achieved using a delay circuit placed between the drivers. If a falling input voltage is received, then an initial stage pull-down transistor 14 will be activated. Transistor 14 receives logic high input upon its gate terminal. The high gate voltage is achieved by the low input signal activating p-channel transistor 44 thereby causing a high voltage from first power supply to pass through passgate 30 and upon gate terminal of transistor 14. Transistor 14, by being on, initiates sinking of current during the falling input transition. Simultaneous with turn on of pull-down transistor 14, transistors 12, 16 and 20 receive deactivating feed forward high voltage from transistors 44, 46 and 48.

After transistor 14 is activated during falling input transition, a set delay period expires and then transistor 18 is activated by a signal sent from a first pull-down delay circuit 62. Circuit 62 includes a first inverter circuit 66 coupled to receive input from the gate terminal of transistor 14. Inverter 66 provides a timing delay between the gate terminal of transistor 14 and transistor 18. Circuit 62 also includes three stacked transistors coupled in series between the first power supply and the gate terminal of transistor 18. A first stacked transistor 68 has a gate terminal adapted to receive output from inverter 66. First stacked transistor 68 is placed in series with and adjacent to a second stacked transistor 70. Transistor 70 receives the falling input signal slightly before low level signal is sent from inverter 66 to transistor 68. Since low level input previously exists at transistor 70 and low level input is received at transistor 68, and provided third stacked transistor 72 receives low logic level from tri state circuit 36, series connected p-channel transistors ensure conductive path will be formed between first power supply and the gate terminal of transistor 18. The conductive path thereby places a high level signal upon the gate terminal of transistor 18 forcing turn on of transistor 18 subsequent to turn on of transistor 14. Of course, disable transistor 52 must remain deactive and transistor 68, 70 and 72 must receive a low logic level in order to produce the desired delayed turn on of transistor 18.

A second pull-down delay circuit 64 operates similar to circuit 62. Second delay circuit 64 utilizes series connected fourth, fifth and sixth stacked transistors 74, 76 and 78, respectively, as shown. A conductive path between first power supply and the gate terminal of transistor 22 is formed if low level input is received at each of transistor 74, 76 and 78. Low level input upon transistor 74, however, does not occur until after second inverter circuit 80 receives a logic high input (i.e., inverter 80 does not produce a low level output until transistor 18 is activated). Once transistor 22 is activated, multiple stage pull-down operation of the present invention is completed.

A first pull-up delay circuit 82 is shown in FIG. 1 placed between the gate terminal of first pull-up transistor 12 and second pull-up transistor 16. First pull-up delay circuit 82 comprises elements similar to first and second pull-down delay circuits 62 and 64. Namely, first pull-up delay circuit 82 includes a first inverter circuit 84 and first, second and third stacked transistors 86, 88 and 90. A delayed low level signal is presented upon the gate terminal of pull-up transistor 16 when all three transistors 86, 88 and 90 are activated. Low level input upon the gate terminal of transistor 16 causes transistor 16 to turn on and pull-up output terminal 24. A second pull-up delay circuit 92 is shown placed between the second and third pull-up transistors 16 and 20, respectively. Second pull-up delay circuit includes a second inverter circuit 94 and fourth, fifth and sixth stacked transistors 96, 98 and 100. Delayed low level signal output from circuit 92 causes pull-up transistor 20 to turn on and thereby complete the multiple stage pull-up operation of the present invention.

It is important to note that more or less than three stages may be used depending upon the amount of noise reduction needed. For example, if a digital output signal must drive a large fan-out load, relatively large driver transistors may be needed. In an effort to reduce large transients associated with large drivers, more than three stages may be needed in order to spread the time duration of pull-up or pull-down operation. An increased time duration will decrease di/dt and thereby decrease power supply noise, overshoot and undershoot.

It is also important to note that in order for circuit 10 to operate, tri state circuit must receive a proper logic signal in order to disable the selected third stacked transistors and disable transistors. If, for example, a low level output is desired, then stacked transistors 72 and 78 will be activated and stacked transistors 90 and 100 will be deactivated. Similarly, a low level output necessitates activation of fourth, fifth and sixth disable transistors 56, 58 and 60, and deactivation of first, second and third disable transistors 50, 52 and 54. Opposite activation and deactivation occurs if a high level output is desired.

Figure 2:
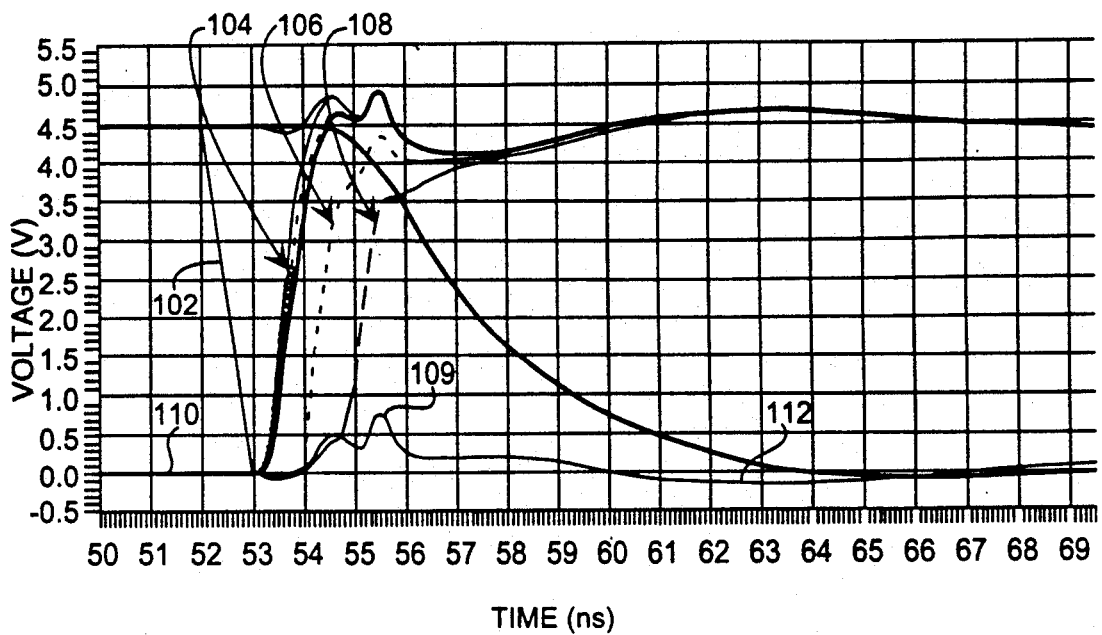
FIG. 2 illustrates pull-up and pull-down transistor switching waveforms and associated second power supply noise during falling edge output according to the present invention.

Operation of an exemplary simulation of circuit 10 is illustrated in FIG. 2 during a transition time in which circuit 10 receives a falling edge input signal 102. Soon after the input transitions to a low level, voltages at the gate terminal of transistor 14 as well as the gate terminals of first, second and third pull-up transistors 12, 16 and 20, respectively, transition to a high level as shown by curve 104. High level transition at the gate of pull-up p-channel transistors ensures that each of the three stages of pull-up transistors are deactivated. Voltage at the gate terminal of the first pull-down transistor 14 transitions to a high state at substantially the same time in which pull-up transistors are turned off. A short delay period after the gate terminals of transistors 12, 14, 16 and 20 receive the relatively high level voltage value, the gate terminal of second pull-down transistor 18 receives a high level as shown by curve 106. Still further, after another delay period, a high level appears upon the gate terminal of pull-down transistor 22 as indicated by curve 108. The acceleration of sinking current from the load device to the second power supply, or VSS, causes a slight noise overshoot 109 in the second power supply curve 110. Subsequently, deceleration or undershoot 112 occurs several nanoseconds later. Given the exemplary simulation results illustrated in FIG. 2, a peak overshoot appears in the second power supply at approximately 0.8 volt deviation from the ideal supply level (e.g., 0.0 volts). A peak undershoot appears to be approximately −0.3 volts. The multiple stage turn-on of the n-channel pull-down transistors subsequent to opposing p-channel turn-off ensures relatively small overshoot and undershoot noise levels upon the second power supply.

Figure 3:
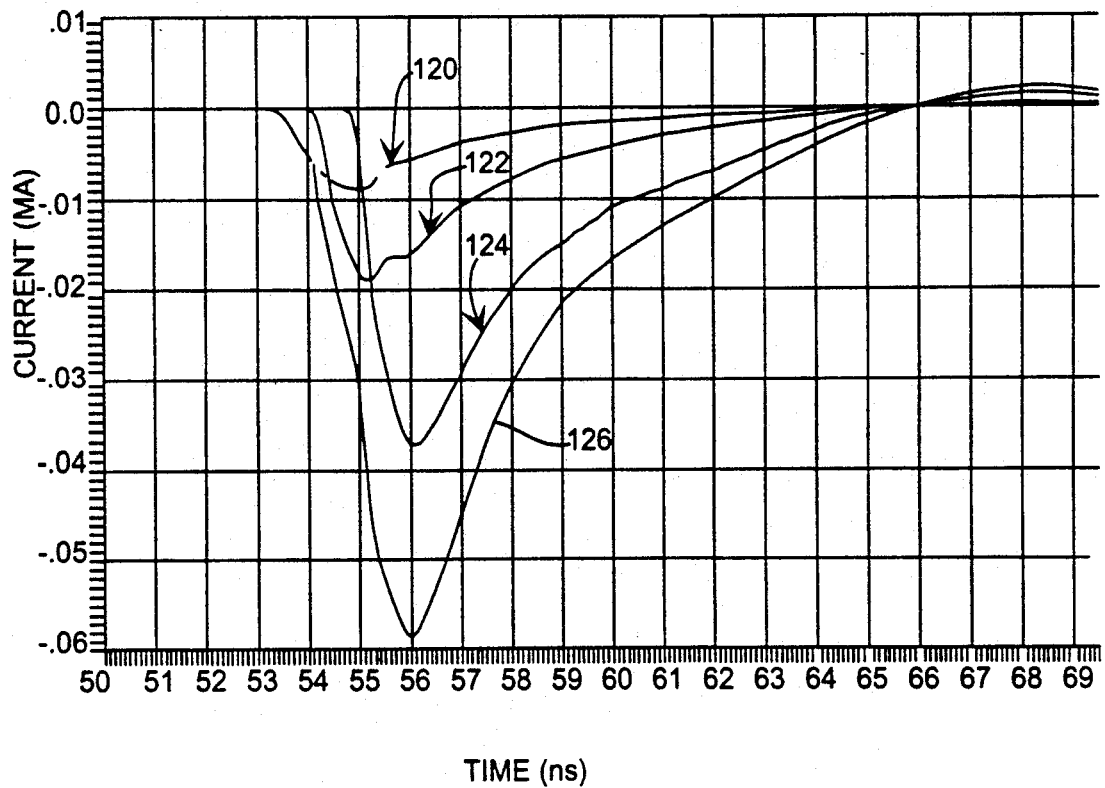
FIG. 3 illustrates change in sinking current waveform through each pull-down transistor stage as a function of time according to the present invention.

FIG. 3 illustrates relative change in sinking current appearing through first, second and third pull-down transistors. Sinking current appearing through first pull-down transistor 14 is shown by curve 120. Subsequent, sinking current appearing through second and third pull-down transistors 18 and 22 are indicated by curves 122 and 124, respectively. The cumulative amount of sinking current is shown by curve 126. Sinking current appearing upon the second power supply is approximately 0.059 amperes (A). The relative change in sinking current as a function of time (or di/dt), appears to be approximately 59 mA/2.5 ns for the exemplary simulation results indicated in FIG. 3.

Figure 4:
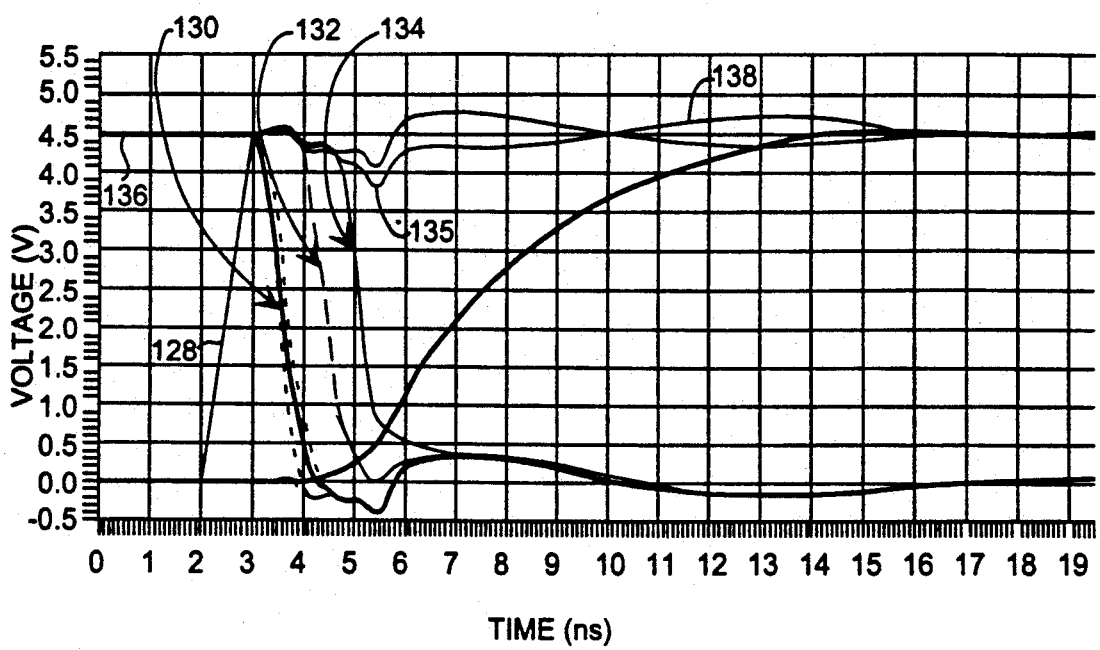
FIG. 4 illustrates pull-up and pull-down transistor switching waveforms and associated first power supply noise during rising edge output according to the present invention.
Figure 5:
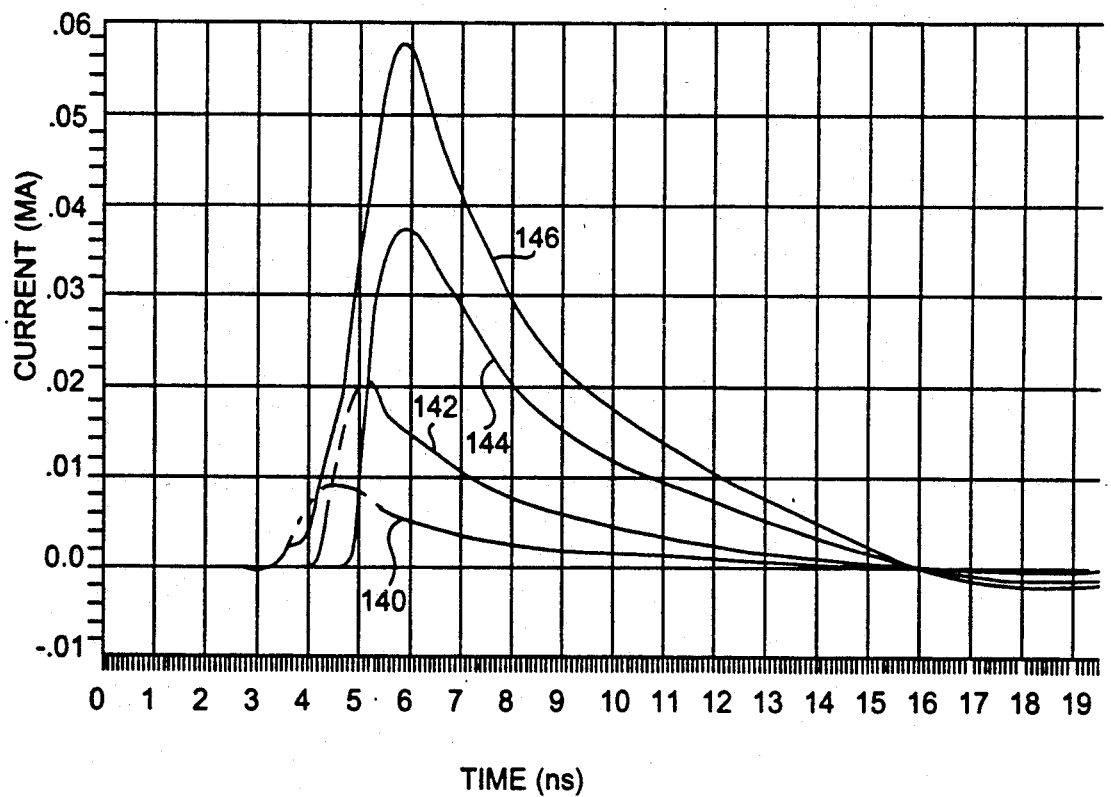
FIG. 5 illustrates change in sourcing current waveform through each pull-up transistor stage as a function of time according to the present invention.

Referring now to FIGS. 4 and 5, rising edge input and resulting delayed turn on of pull-up transistors is indicated. Rising edge input signal 128 is shown affecting logic low transition 130 at the gate terminals of pull-down transistors 14, 18 and 22 as well as first pull-up transistor 12. After a delay time period, second pull-up transistor 16 is activated by a logic low transition 132 appearing at its gate terminal. Subsequently, another logic low transition 132 appears at the gate terminal of third pull-up transistor 20. Undershoot 135 upon the first power supply curve 136 appears as approximately 0.8 volts below the ideal power supply level (e.g., 4.5 volts). Soon thereafter, deceleration of sourcing current appears as overshoot upon curve 138 of approximately 0.3 volts above the first power supply curve 136.

FIG. 5 indicates change in sourcing current as a function of time through first, second and third pull-up transistors as indicated by curves 140, 142 and 144, respectively. A cumulative sourcing current from the first power supply to the load is shown by curve 146 to have a maximum current value of approximately 0.059 mA. Thus, comparison between FIGS. 3 and 5 indicates a fairly well balanced pull-up sourcing and pull-down sinking operation. Moreover, change in sourcing current as a function of time (or di/dt) is approximately 59 mA/2.5 ns, similar to di/dt indicated in FIG. 3.

It is important to note that the simulation results illustrated in the graphs of FIGS. 2-5 are obtained using a specific gate geometry or circuit interconnect layout for the devices indicated in FIG. 1. CMOS technology is chosen in this exemplary embodiment to produce the illustrated simulation. However, transistor sizes and interconnect layout may be varied to achieve target results depending upon user requirements. Further, other technologies such as bipolar may be substituted for one or more CMOS FET shown in FIG. 1 to achieve varying results.

It will be appreciated by those skilled in the art having the benefit of this disclosure that this invention is believed to be capable of applications with numerous types of transistors, either bipolar of MOS, either enhancement or depletion MOS transistors, or either less than three or more than three stages of operation. Furthermore, it is also to be understood that the form of the invention shown and described is to be taken as an exemplary preferred embodiment. Various modifications and changes may be made without departing from the spirit and scope of the invention as set forth in the claims. An exemplary modification might be one which uses another form of buffer input circuit or tri state circuit in lieu of circuits 28 and 36. The buffer input circuit or tri state circuit may be placed upon the same monolithic circuit or on an external monolithic circuit. Still further, other forms of stacked logic may be used instead of the stacked transistor arrangement illustrated. It is intended that the following claims be interpreted to embrace all such modifications and changes which provide substantially the same function as that described herein.

What is claimed is:

1. An output buffer circuit comprising:
   first, second and third pull-up transistors connected in parallel between a first power supply and an output terminal;
   first, second and third pull-down transistors connected in parallel between a first power supply and an output terminal;
   feed forward circuit means for turning off said first, second and third pull-up transistors at substantially the same time as said first pull-down transistor is turned on;
   first pull-down delay means for delaying turn on of said second pull-down transistor with respect to turn on of said first-pull-down transistor, said first pull-down delay means comprises:
      a first inverter circuit coupled between a gate terminal of said first pull-down transistor and a gate terminal of a first stacked transistor;
      said first stacked transistor is placed in series with a second and third stacked transistors, wherein said first, second and third stacked transistors are coupled between the gate terminal of said second pull-down transistor and said first power supply;
      said second stacked transistor is adapted to receive a digital input signal;
      said third stacked transistor is adapted to receive output from a tri state means;
   second pull-down delay means for delaying turn on of said third pull-down transistor with respect to turn on of said second pull-down transistor, said second pull-down means comprises:
      a second inverter circuit coupled between a gate terminal of said second pull-down transistor and a gate terminal of a fourth stacked transistor;
      said fourth stacked transistor is placed in series with a fifth and sixth stacked transistors wherein said fourth, fifth and sixth stacked transistors are coupled between the gate terminal of said third pull-down transistor and said first power supply;
      said fifth stacked transistor is adapted to receive a digital input signal; and
      said sixth stacked transistor is adapted to receive output from a tri state means.

2. The output buffer circuit as recited in claim 1, further comprising:
   a passgate circuit connected to a gate terminal of said first pull-up transistor and a gate terminal of said first pull-down transistor; and
   said tri sate means having an output coupled to said passgate circuit for allowing said passgate circuit to receive said digital input signal and for passing said input signal to the gate terminal of said first pull-up transistor and to the gate terminal of said first pull-down transistor.

3. The output buffer circuit as recited in claim 2, wherein said tri state circuit comprises a pair of series connected inverters, one of said pair of inverter is capable of producing a disable output digital signal of logic level opposite the logic level produced by the other of said pair of inverters.

4. The output buffer circuit as recited in claim 1, wherein said first, second and third pull-down transistors are FET n-channel transistors of dissimilar gate widths, said first pull-down transistor gate width is smaller than said second pull-down transistor gate width, said second pull-down transistor gate width is smaller than said third pull-down transistor gate width.

5. The output buffer circuit as recited in claim 1, wherein said feed forward circuit means comprises:
   first, second and third feed forward transistors, each first, second and third feed forward transistor including:
      a gate terminal adapted to receive a digital input signal;
      a conductive path modulated by said input signal;
   said conductive paths of the first, second and third feed forward transistors are coupled between said second power supply and a gate terminal of said first, second and third pull-down transistors, respectively;

first, second and third disable transistors, each first, second and third disable transistor including:
a gate terminal adapted to receive an disable digital signal produced from a tri state means;
a conductive path modulated by said disable signal; and
said conductive paths of the first, second and third disable transistors are coupled in parallel with said first, second and third feed forward transistors, respectively.

6. An output buffer circuit comprising:
first, second and third pull-up transistors connected in parallel between a first power supply and an output terminal;
first, second and third pull-down transistors connected in parallel between a first power supply and an output terminal;
feed forward means for turning off said first, second and third pull-down transistors at substantially the same time as said first pull-up transistor is turned on;
first pull-up delay means for delaying turn on of said second pull-up transistor with respect to turn on of said first pull-up transistor, said first pull-up delay means comprises:
a first inverter circuit coupled between a gate terminal of said first pull-up transistor and a gate terminal of a first stacked transistor;
said first stacked transistor is placed in series with a second and third stacked transistors, wherein said first, second and third stacked transistors are coupled between the gate terminal of said second pull-up transistor and said second power supply;
said second stacked transistor is adapted to receive a digital input signal;
said third stacked transistor is adapted to receive output from a tri state means;
second pull-up delay means for delaying turn on of said third pull-up transistor with respect to turn on of said second pull-up transistor, said second pull-up delay means comprises:
a second inverter circuit coupled between a gate terminal of said second pull-up transistor and a gate terminal of a fourth stacked transistor;
said fourth stacked transistor is placed in series with a fifth and sixth stacked transistors, wherein said fourth, fifth and sixth stacked transistors are coupled between the gate terminal of said third pull-up transistor and said second power supply;
said fifth stacked transistor is adapted to receive a digital input signal; and
said sixth stacked transistor is adapted to receive output from a tri state mean.

7. The output buffer circuit as recited in claim 6, further comprising:
a passgate circuit connected to a gate terminal of said first pull-up transistor and a gate terminal of said first pull-down transistor; and
said tri state mean having an output coupled to said passgate circuit for allowing said passgate circuit to receive said digital input signal and for passing said input signal to the gate terminal of said first pull-up transistor and to the gate terminal of said first pull-down transistor.

8. The output buffer circuit as recited in claim 7, wherein said tri state means comprises a pair of series connected inverters, one of said pair of inverters is capable of producing a disable output digital signal of logic level opposite the logic level produced by the other of said pair of inverters.

9. The output buffer circuit as recited in claim 6, wherein said first, second and third pull-up transistors are FET p-channel transistors of dissimilar gate widths, said first pull-down transistor gate width is smaller than said second pull-down transistor gate width, said second pull-down transistor gate width is smaller than said third pull-down transistor gate width.

10. The output buffer circuit as recited in claim 6, wherein said feed forward circuit means comprises:
fourth, fifth and sixth feed forward transistors, each fourth, fifth and sixth feed forward transistor including:
a gate terminal adapted to receive a digital input signal;
a conductive path modulated by said input signal;
said conductive paths of the fourth, fifth and sixth feed forward transistors are coupled between said first power supply and a gate terminal of said first, second and third pull-up transistors, respectively;
fourth, fifth and sixth disable transistor, each fourth, fifth and sixth disable transistor including:
a gate terminal adapted to receive an disable digital signal produced from a tri state means;
a conductive path modulated by said disable signal; and
said conductive paths of the fourth, fifth and sixth disable transistors are coupled in parallel with said fourth, fifth and sixth feed forward transistors, respectively.

11. An output buffer circuit for generating a buffered, relatively high digital output signal in response to a relatively high digital input signal, comprising:
first, second and third pull-up transistors connected in parallel between a first power supply and an output terminal capable of receiving said high digital output signal, each said pull-up transistor having a gate terminal;
first, second and third pull-down transistors connected in parallel between a second power supply and said output terminal capable of receiving said high digital output signal, each said pull-down transistor having a gate terminal;
a passgate circuit connected to the gate terminal of said first pull-up transistor and the gate terminal of said first pull-down transistor;
a tri state means having an output coupled to said passgate circuit for allowing said passgate circuit to receive said high digital input signal and pass said input signal to the gate terminal of said first pull-up transistor and the gate terminal of said first pull-down transistor;
feed forward circuit means for receiving said high digital input signal and for turning off said first, second and third pull-down transistors and for turning on said first pull-up transistor at substantially the same time, said feed forward circuit means comprises:
first, second and third feed forward transistors, each first, second and third feed forward transistor including:
a gate terminal adapted to receive said high digital input signal at substantially the same time;
a conductive path modulated by said high digital input signal;

said conductive paths of the first, second and third feed forward transistors are coupled between said second power supply and the gate terminal of said first second and third pull-down transistors, respectively;

first pull-down delay means for delaying turn-on of said second pull-down transistor with respect to turn on of said first pull-down transistor, said first pull-down delay means comprises:
- a first inverter circuit to coupled between a gate terminal of said first pull-down transistor and a gate terminal of a first stacked transistor;
- said first stacked transistor is placed in series with a second and third stacked transistors, wherein said first, second and third stacked transistors are coupled between the gate terminal of said second pull-down transistor and said first power supply;
- said second stacked transistor is adapted to receive a digital input signal;
- said third stacked transistor is adapted to receive output from a tri state means;

second pull-down delay mean for delaying turn on of said third pull-down transistor with respect to turn on of said second pull-down transistor, said second pull-down delay mean comprises:
- a second inverter circuit coupled between the gate terminal of said second pull-down transistor and a gate terminal of a fourth stacked transistor;
- said fourth stacked transistor is placed in series with a fifth and sixth stacked transistors, wherein said fourth, fifth and sixth stacked transistors are coupled between the gate terminal of said third pull-down transistor and said first power supply;
- said fifth stacked transistor is adapted to receive said high input signal; and
- said sixth stacked transistor is adapted to receive output from said tri state means.

12. An output buffer circuit for generating a buffered, relatively low digital output signal in response to a relatively low digital input signal, comprising:
- first, second and third pull-up transistors connected in parallel between a first power supply and an output terminal capable of receiving said low digital output signal, each said pull-up transistor having a gate terminal;
- first, second and third pull-down transistors connected in parallel between a first power supply and an output terminal capable of receiving said low digital output signal, each said pull-down transistor having a gate terminal;
- a passgate circuit connected to the gate terminal of said first pull-up transistor and the gate terminal of said first pull-down transistor;
- a tri state means having an output coupled to said passgate circuit for allowing said passgate circuit to receive said low digital input signal and pass said input signal to the gate terminal of said first pull-up transistor and the gate terminal of said first pull-down transistor;

feed forward circuit means for receiving said low digital input signal and for turning off said first, second and third pull-up transistors and for turning on said first pull-down transistor at substantially the same time, said feed forward circuit means comprises:
fourth, fifth and sixth feed forward transistors, each fourth, fifth and sixth feed forward transistor including:
- a gate terminal adapted to receive said low digital input signal at substantially the same time;
- a conductive path modulated by said low digital input signal;
said conductive paths of the fourth, fifth and sixth feed forward transistors are coupled between said first power supply and the gate terminal of said first, second and third pull-up transistors, respectively;

first pull-up delay mean for delaying turn-on of said second pull-up transistor with respect to turn on of said first pull-up transistor, said first pull-up delay means comprises:
- a first inverter circuit coupled between a gate terminal of said first pull-down transistor and a gate terminal of a first stacked transistor;
- said first stacked transistor is placed in series with a second and third stacked transistors, wherein said first, second and third stacked transistors are coupled between the gate terminal of said second pull-up transistor and said second power supply;
- said second stacked transistor is adapted to receive a digital input signal;
- said third stacked transistor is adapted to receive output from a tri state means;

second pull-up delay means for delaying turn on of said third pull-up transistor with respect to turn on of said second pull-up transistor, said second pull-up delay means comprises:
- a second inverter circuit coupled between the gate terminal of said second pull-down transistor and a gate terminal of a fourth stacked transistor;
- said fourth stacked transistor is placed in series with a fifth and a sixth stacked transistors, wherein said fourth, fifth and sixth stacked transistor are coupled between the gate terminal of said third pull-down transistor and said first power supply;
- said first stacked transistor is adapted to receive said high input signal; and
- said sixth stacked transistor is adapted to receive output from said tri state means.

* * * * *

UNITED STATES PATENT AND TRADEMARK OFFICE
CERTIFICATE OF CORRECTION

PATENT NO. : 5,329,175

DATED : July 12, 1994

INVENTOR(S) :
Craig M. Peterson

It is certified that error appears in the above-indentified patent and that said Letters Patent is hereby corrected as shown below:

Claim 1, col. 9, line 63, please delete "first" and substitute therefor --second--.

Claim 1, col. 9, line 64, please delete "an" and substitute therefor --said--.

Claim 2, col. 10, line 39, please delete "sate" and substitute therefor --state--.

Claim 3, col. 10, line 47, please delete "inverter" and substitute therefor --inverters--.

Claim 11, col. 14, line 22, please delete "mean" and substitute therefor --means--.

Signed and Sealed this

First Day of November, 1994

Attest:

BRUCE LEHMAN

Attesting Officer

Commissioner of Patents and Trademarks